(12) United States Patent
Kawahata et al.

(10) Patent No.: US 9,702,909 B2
(45) Date of Patent: Jul. 11, 2017

(54) MANUFACTURING METHOD FOR CURRENT SENSOR AND CURRENT SENSOR

(71) Applicant: ALPS ELECTRIC CO., LTD., Tokyo (JP)

(72) Inventors: Ken Kawahata, Miyagi-ken (JP); Nobuyoshi Yamasaki, Miyagi-ken (JP); Masatoshi Nomura, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 160 days.

(21) Appl. No.: 14/540,978

(22) Filed: Nov. 13, 2014

(65) Prior Publication Data

US 2015/0069997 A1 Mar. 12, 2015

Related U.S. Application Data

(63) Continuation of application No. PCT/JP2013/004168, filed on Jul. 4, 2013.

(30) Foreign Application Priority Data

Jul. 6, 2012 (JP) .................................. 2012-152778

(51) Int. Cl.
*G01R 19/32* (2006.01)
*G01R 3/00* (2006.01)
(Continued)

(52) U.S. Cl.
CPC .............. *G01R 19/32* (2013.01); *G01R 1/30* (2013.01); *G01R 3/00* (2013.01); *G01R 15/207* (2013.01);
(Continued)

(58) Field of Classification Search
CPC ...... G01R 19/32; G01R 15/207; G01R 19/25; H03F 3/45475; H03F 3/45968
See application file for complete search history.

(56) References Cited

U.S. PATENT DOCUMENTS

| | | | | |
|---|---|---|---|---|
| 6,232,562 B1 * | 5/2001 | Kikuchi | ............... | H05K 1/0218 174/255 |
| 6,509,734 B1 * | 1/2003 | Luetzow | ............... | G01D 5/145 324/207.12 |
| 7,375,515 B2 * | 5/2008 | Omagari | ............... | G01R 33/02 324/225 |

FOREIGN PATENT DOCUMENTS

| | | |
|---|---|---|
| JP | 58-39577 U | 3/1983 |
| JP | 03-170073 | 7/1991 |

(Continued)

OTHER PUBLICATIONS

Search Report dated Sep. 3, 2013 from International Application No. PCT/JP2013/004168.

*Primary Examiner* — Jermele M Hollington
*Assistant Examiner* — Feba Pothen
(74) *Attorney, Agent, or Firm* — Beyer Law Group LLP

(57) ABSTRACT

A manufacturing method is used for a current sensor including a current measurement circuit configured to include magnetoelectric conversion elements, a first amplification-and-correction circuit configured to amplify an output of the current measurement circuit and correct, based on a set first correction amount, a temperature characteristic of an offset, a second amplification-and-correction circuit configured to amplify an output of the first amplification-and-correction circuit, adjust a sensitivity, and correct, based on a set second correction amount, a magnitude of the offset, and a substrate in which the current measurement circuit, the first amplification-and-correction circuit, and the second amplification-and-correction circuit are provided, wherein after the first correction amount is set based on characteristics of the magnetoelectric conversion elements, the magnetoelectric conversion elements are mounted in the substrate and the second correction amount is set.

5 Claims, 10 Drawing Sheets

(51) Int. Cl.
*G01R 15/20* (2006.01)
*G01R 1/30* (2006.01)
*G01R 19/25* (2006.01)
*G01R 33/09* (2006.01)
*G01R 35/00* (2006.01)
*H03F 1/30* (2006.01)
*H03F 3/45* (2006.01)

(52) U.S. Cl.
CPC .............. *G01R 19/25* (2013.01); *G01R 33/09* (2013.01); *G01R 35/00* (2013.01); *H03F 1/30* (2013.01); *H03F 3/45475* (2013.01); *H03F 3/45968* (2013.01); *H03F 2200/228* (2013.01); *H03F 2200/261* (2013.01); *H03F 2200/411* (2013.01); *H03F 2203/45528* (2013.01); *Y10T 29/4902* (2015.01)

(56) References Cited

FOREIGN PATENT DOCUMENTS

| | | |
|---|---|---|
| JP | 05-018994 | 1/1993 |
| JP | 06-186253 | 7/1994 |
| JP | 07-020155 | 1/1995 |
| JP | 2006-003209 | 1/2006 |

* cited by examiner

MANUFACTURING METHOD FOR CURRENT SENSOR AND CURRENT SENSOR

CLAIM OF PRIORITY

This application is a Continuation of International Application No. PCT/JP2013/004168 filed on Jul. 4, 2013, which claims benefit of Japanese Patent Application No. 2012-152778 filed on Jul. 6, 2012. The entire contents of each application noted above are hereby incorporated by reference.

BACKGROUND OF THE INVENTION

1. Field of the Invention

The present invention relates to a current sensor capable of measuring, in a non-contact manner, a current to be measured, and a manufacturing method for the current sensor.

2. Description of the Related Art

In fields such as electric vehicles and solar batteries, there have been used current sensors each of which is able to measure a current value in a non-contact manner, based on an induction magnetic field generated by a current to be measured. This current sensor includes magnetoelectric conversion elements used for detecting the induction magnetic field generated by the current to be measured, and calculates the current value of the current to be measured, based on a magnetic field strength detected by the magnetoelectric conversion elements. As the magnetoelectric conversion elements, for example, Hall elements each of which converts a magnetic field strength into an electric signal using the Hall effect, magnetoresistance effect elements each of which utilizes a change in an electrical resistance value due to a magnetic field, and so forth have been used.

In general, the magnetoelectric conversion elements used for a current sensor each have an individual characteristic variation. Therefore, in order to obtain sufficiently high current measurement accuracy, the adjustment of gain (sensitivity) and the adjustment of an offset (the deviation of a sensor output from a reference value when the current to be measured is 0 A), performed for each current sensor, are important. For example, in Japanese Unexamined Patent Application Publication No. 2006-3209, there has been proposed a current sensor enabling the temperature change of an offset to be reduced, using temperature-sensitive elements whose resistance values fluctuate in response to temperature.

The current sensor described in Japanese Unexamined Patent Application Publication No. 2006-3209 achieves high current measurement accuracy by adjusting an offset using the temperature-sensitive elements. However, in this configuration, it is necessary to actually measure a temperature characteristic while changing a condition for sensing of the current sensor at the time of adjusting the offset. Therefore, there is a problem that an adjustment process becomes complicated. In addition, in this current sensor, the temperature-sensitive elements are essential to adjust the temperature change of the offset.

The present invention is made in view of such a point, and provides a current sensor capable of achieving high current measurement accuracy by simple adjustment, and a manufacturing method for the current sensor.

SUMMARY OF THE INVENTION

A manufacturing method for a current sensor of the present invention is a manufacturing method for a current sensor including a current measurement circuit configured to include magnetoelectric conversion elements, a first amplification-and-correction circuit configured to amplify an output of the current measurement circuit and correct, based on a set first correction amount, a temperature characteristic of an offset, a second amplification-and-correction circuit configured to amplify an output of the first amplification-and-correction circuit, adjust a sensitivity, and correct, based on a set second correction amount, a magnitude of the offset, and a substrate in which the current measurement circuit, the first amplification-and-correction circuit, and the second amplification-and-correction circuit are provided, wherein after the first correction amount is set based on characteristics of the magnetoelectric conversion elements, the magnetoelectric conversion elements are mounted in the substrate and the second correction amount is set.

According to this configuration, the first amplification-and-correction circuit configured to correct the temperature characteristic of the offset and the second amplification-and-correction circuit configured to correct the magnitude of the offset are separately provided, and after the first correction amount is set in the first amplification-and-correction circuit, based on the characteristics of the magnetoelectric conversion elements, and the temperature characteristic of the offset is corrected, the second correction amount is set in the second amplification-and-correction circuit and the magnitude of the offset is corrected. Therefore, it is possible to perform correction of the temperature characteristic of the offset and correction of the magnitude of the offset in an isolated manner. From this, it is unnecessary to acquire temperature characteristics under many conditions, and it is possible to achieve high current measurement accuracy by simple adjustment.

It is desirable that, in the manufacturing method for a current sensor of the present invention, the first correction amount is set so that influence of the temperature characteristic of the offset becomes small. According to this configuration, the first correction amount is set based on the characteristics of the magnetoelectric conversion elements, measured in advance, so that the influence of the temperature characteristic of the offset becomes small. Therefore, it is possible to adequately remove the influence of the temperature characteristic of the offset using the first amplification-and-correction circuit.

It is desirable that, in the manufacturing method for a current sensor of the present invention, each of the magnetoelectric conversion elements is a magnetoresistance effect element. The characteristic variations of the magnetoresistance effect elements within a same lot or a same wafer are small. Therefore, as for the magnetoresistance effect elements in the same lot or the same wafer, the characteristic of a typical sample may be used in common. In other words, according to the above-mentioned configuration, it is unnecessary to actually measure the temperature characteristics of all the magnetoresistance effect elements, and it is possible to further simplify adjustment.

It is desirable that, in the manufacturing method for a current sensor of the present invention, a magnetic proportional type utilizing the output of the current measurement circuit proportional to an external magnetic field is adopted.

It is desirable that, in the manufacturing method for a current sensor of the present invention, the current sensor is a differential type performing a differential operation on outputs of the current measurement circuits. According to this configuration, it is possible to cancel out the temperature characteristics of offsets by putting the current sensor into the differential type.

A current sensor of the present invention includes a current measurement circuit including magnetoelectric conversion elements, a first amplification-and-correction circuit configured to amplify an output of the current measurement circuit and correct, based on a set first correction amount, a temperature characteristic of an offset, a second amplification-and-correction circuit configured to amplify an output of the first amplification-and-correction circuit, adjust a sensitivity, and correct, based on a set second correction amount, a magnitude of the offset, and a substrate in which the current measurement circuit, the first amplification-and-correction circuit, and the second amplification-and-correction circuit are provided.

It is desirable that, in the current sensor of the present invention, the first correction amount is set so that influence of the temperature characteristic of the offset becomes small.

It is desirable that, in the current sensor of the present invention, each of the magnetoelectric conversion elements is a magnetoresistance effect element.

It is desirable that, in the current sensor of the present invention, a magnetic proportional type utilizing the output of the current measurement circuit proportional to an external magnetic field is adopted.

It is desirable that, in the current sensor of the present invention, a differential type performing a differential operation on outputs of the current measurement circuits is adopted.

DESCRIPTION OF THE PREFERRED EMBODIMENTS

The reason why a process for adjusting an offset (the deviation of a sensor output from a reference value when a current to be measured is 0 A) is complicated in a current sensor of the related art is that it is necessary to variously change a condition for sensing of a current sensor and actually measure a temperature characteristic at each condition. The present inventor focuses attention on this point, and finds out that a circuit for reducing the temperature dependency of the offset and a circuit for correcting the magnitude (absolute value) of the offset are separately provided, correction of the temperature characteristic of the offset and correction of the magnitude of the offset are isolated from each other, and thus, it is possible to achieve high current measurement accuracy by simple adjustment.

In other words, an outline of the present invention is to separately provide a first amplification-and-correction circuit configured to correct the temperature characteristic of the offset and a second amplification-and-correction circuit configured to correct the magnitude of the offset. According to this configuration, it is possible to reduce the temperature dependency of the offset by the first amplification-and-correction circuit, and to correct the magnitude of the offset by the second amplification-and-correction circuit, in a state in which the temperature dependency is reduced. Therefore, it is unnecessary to actually measure the temperature characteristic under many conditions, and it is possible to achieve high current measurement accuracy by simple adjustment. Hereinafter, a current sensor of the present invention and a manufacturing method therefor will be described with reference to accompanying drawings.

First Embodiment

Figure 1:
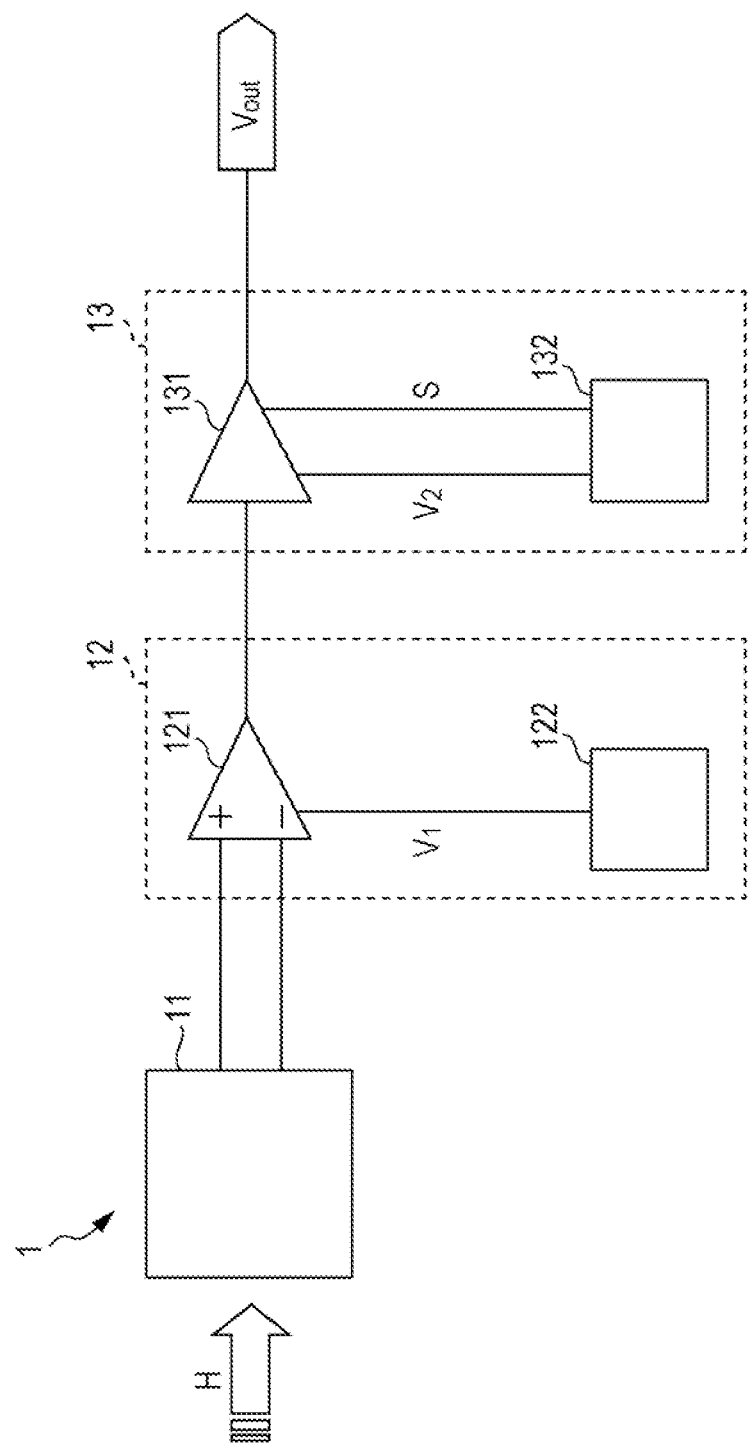
FIG. 1 is a block diagram illustrating an example of a configuration of a magnetic proportional type current sensor according to a first embodiment.

FIG. 1 is a block diagram illustrating an example of the configuration of a magnetic proportional type current sensor according to the present embodiment. As illustrated in FIG. 1, a current sensor 1 of the present embodiment includes a current measurement circuit 11 that converts an induction magnetic field H generated by a current to be measured into an electric signal. An amplification-and-correction circuit (a first amplification-and-correction circuit) 12, which amplifies and corrects the output of the current measurement circuit 11, is connected in a subsequent stage of the current measurement circuit 11. In addition, a correct amplification-and-correction circuit (a second amplification-and-correction circuit) 13, which amplifies and corrects the output of the amplification-and-correction circuit 12, is connected in a subsequent stage of the amplification-and-correction circuit 12.

Figure 2:
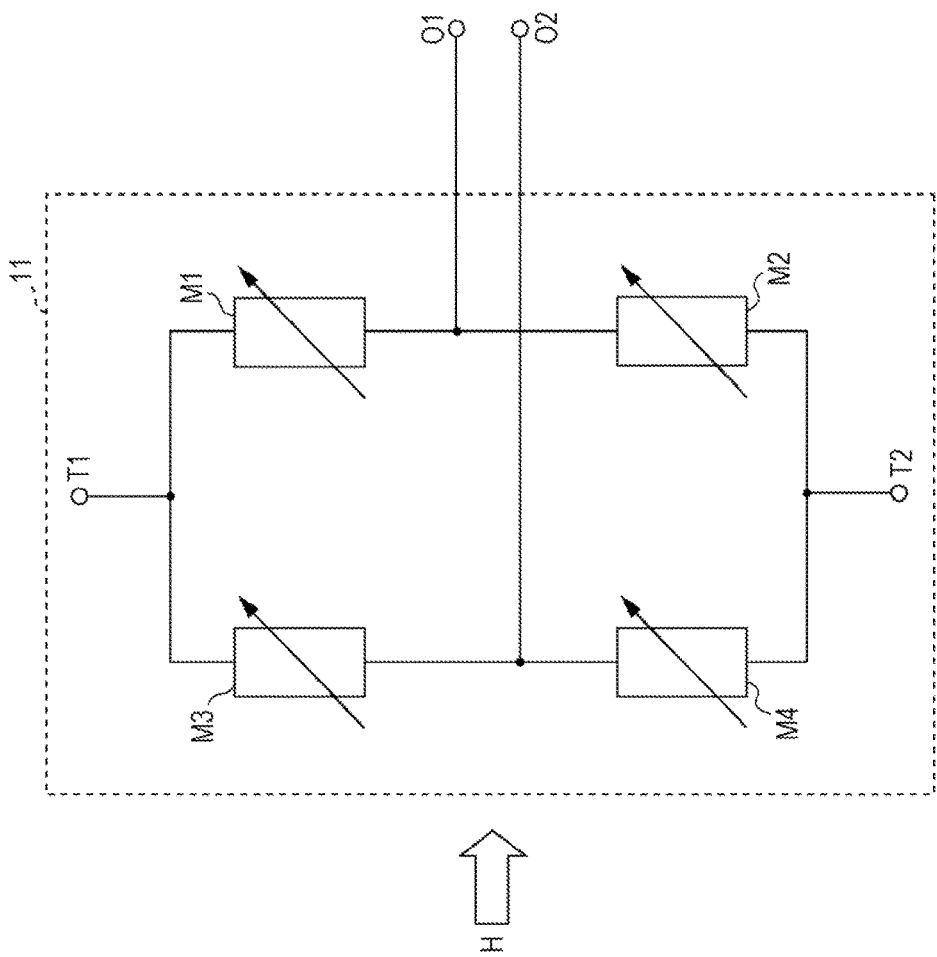
FIG. 2 is a circuit diagram illustrating an example of a configuration of a current measurement circuit according to the first embodiment.

FIG. 2 is a circuit diagram illustrating an example of the configuration of the current measurement circuit 11 according to the present embodiment. As illustrated in FIG. 2, the current measurement circuit 11 may be a bridge circuit including magnetoresistance effect elements M1 to M4 serving as magnetoelectric conversion elements, and is configured so as to output a voltage corresponding to the magnitude of the induction magnetic field H caused by the current to be measured. The magnetoresistance effect elements M1 to M4 may be, for example, giant magneto resistance (GMR) elements whose resistance values change by application of a magnetic field.

In the current measurement circuit 11, a connection point between the magnetoresistance effect elements M1 and M3 is connected to a terminal T1, and a power supply configured to supply a power-supply voltage is connected to the terminal T1. In addition, a connection point between the magnetoresistance effect elements M2 and M4 is connected to a terminal T2, and a ground configured to supply a ground voltage is connected to the terminal T2. A connection point between the magnetoresistance effect elements M1 and M2 is connected to an output terminal O1 of the current measurement circuit 11, and a connection point between the magnetoresistance effect elements M3 and M4 is connected to an output terminal O2 of the current measurement circuit 11. A voltage difference occurring between these two output terminals O1 and O2 fluctuates in response to the magnetic field applied to the current measurement circuit 11, and is sent to a subsequent stage, as the output of the current measurement circuit 11.

The two output terminals O1 and O2 of the current measurement circuit 11 are connected to the non-inverting input terminal (+) and inverting input terminal (−) of an operational amplifier 121, respectively, included in the amplification-and-correction circuit 12. A correction circuit 122 used for correcting the output of the current measurement circuit 11 is connected to the operational amplifier 121. The correction circuit 122 outputs a correction voltage (a first correction voltage $V_1$) in accordance with a set correction amount (a first correction amount), and the operational amplifier 121 corrects the output of the current measurement circuit 11 in accordance with the first correction voltage $V_1$ supplied from the correction circuit 122. In addition, the amplification-and-correction circuit 12 has an amplification function, and the output of the current measurement circuit 11 is amplified with a predetermined amplification factor.

Figure 3:
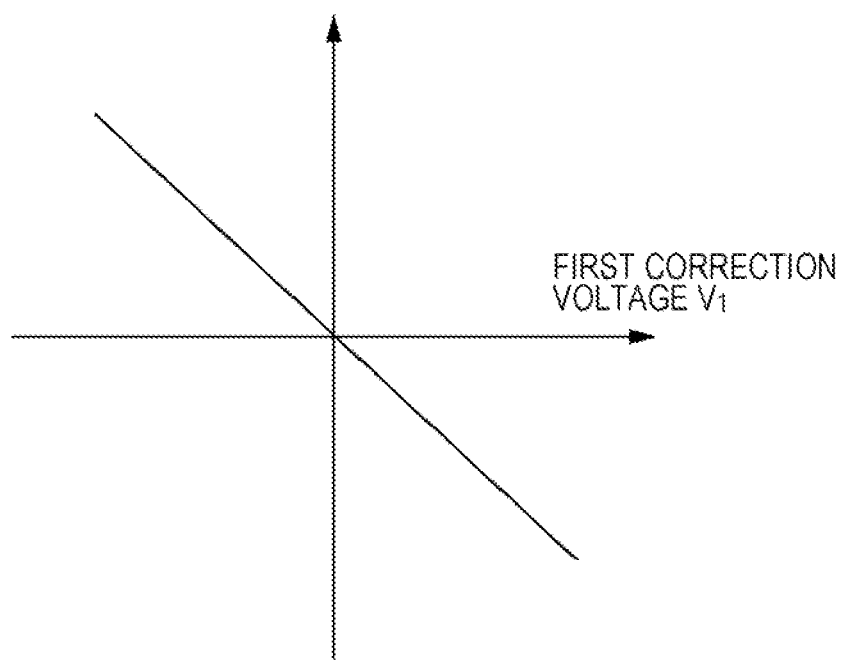
FIG. 3 is a graph illustrating a characteristic of a correction offset of an operational amplifier (a first operational amplifier) according to the first embodiment.

Specifically, in accordance with the first correction voltage $V_1$ supplied from the correction circuit 122, the operational amplifier 121 may add, to the output of the current measurement circuit 11, such a correction offset as to reduce the influence of the temperature dependency of an offset due to the current measurement circuit 11. FIG. 3 is a graph illustrating the characteristic of the correction offset added in the operational amplifier 121. In FIG. 3, a vertical axis indicates the temperature coefficient of the correction offset, and a horizontal axis indicates the first correction voltage $V_1$ supplied to the operational amplifier 121. The temperature coefficient of the correction offset expresses the degree of the temperature dependency of the correction offset.

As illustrated in FIG. 3, the correction offset generated in the operational amplifier 121 has a temperature coefficient proportional to the first correction voltage $V_1$. In FIG. 3, the temperature coefficient of the correction offset generated in the operational amplifier 121 decreases with an increase in the first correction voltage $V_1$. By supplying the adequate first correction voltage $V_1$ from the correction circuit 122 to the operational amplifier 121 having such a temperature characteristic, it is possible to reduce the influence of the temperature dependency of the offset due to the current measurement circuit 11.

An output terminal of the amplification-and-correction circuit 12 (an output terminal of the operational amplifier 121) is connected to an input terminal of an operational amplifier 131 included in the amplification-and-correction circuit 13. A correction circuit 132 used for correcting the output of the amplification-and-correction circuit 12, adjusting a sensitivity, and correcting the magnitude of an offset is connected to the operational amplifier 131. The correction circuit 132 outputs a correction voltage (a second correction voltage $V_2$) and a correction signal (a correction signal S) in accordance with a set correction amount (a second correction amount, a third correction amount), and the operational amplifier 131 corrects an output in accordance with the second correction voltage $V_2$ and the correction signal S, supplied from the correction circuit 132.

Specifically, the operational amplifier 131 corrects the magnitude of the offset in accordance with the second correction voltage $V_2$ supplied from the correction circuit 132, and corrects a sensitivity (an amplification factor) in accordance with the correction signal S supplied from the correction circuit 132. The operational amplifier 131 is configured so that the output thereof is not dependent on temperature (so as not to have a temperature characteristic). From this, in the amplification-and-correction circuit 13, it is possible to only correct the magnitude of the offset and the sensitivity without changing a temperature characteristic. The output of the amplification-and-correction circuit 13 (the output of the operational amplifier 131) after correction is the output of the current sensor 1.

Next, a manufacturing method for the current sensor 1 will be described. The magnetoresistance effect elements M1 to M4 for configuring the current measurement circuit 11 are mounted in a substrate (not illustrated) in which the amplification-and-correction circuits 12 and 13 are mounted, and thus, the current sensor 1 is manufactured. The magnetoresistance effect elements M1 to M4 each have an individual characteristic variation. In the manufacturing method of the present embodiment, in order to correct the temperature characteristic of an offset due to the characteristic variations, the first correction amount is set in the amplification-and-correction circuit 12 (the correction circuit 122) before mounting of the magnetoresistance effect elements M1 to M4. The first correction amount may be set based on the temperature characteristics of the magnetoresistance effect elements M1 to M4 and so forth.

Figure 4:
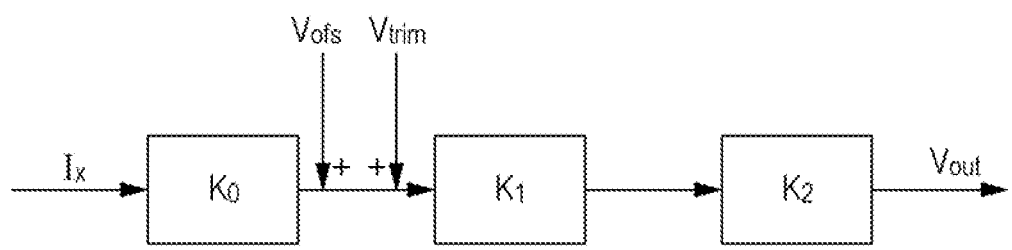
FIG. 4 is a block diagram illustrating a relationship between inputting and outputting of signals of the current sensor according to the first embodiment.

An example of a calculation method for the first correction amount set in the amplification-and-correction circuit 12 will be described. FIG. 4 is a block diagram illustrating a relationship between inputting and outputting of signals of the current sensor 1 of the present embodiment. In FIG. 4, $I_x$ indicates an input signal (corresponding to the current to be measured) to the current measurement circuit 11, $K_0$ indicates the sensitivity of the current measurement circuit 11, $K_1$ indicates the amplification factor of the amplification-and-correction circuit 12, $K_2$ indicates the amplification factor of the amplification-and-correction circuit 13, and $V_{out}$ indicates the output (voltage) of the current sensor 1. In addition, $V_{ofs}$ indicates an offset (voltage) generated in the current measurement circuit 11, and $V_{trim}$ indicates the correction offset (voltage) of the amplification-and-correction circuit 12.

In the current sensor 1, the offset of $V_{out}$ has a temperature characteristic. If it is assumed that temperature is T (° C.), the temperature characteristic (the primary coefficient of temperature) of $V_{ofs}$ is a (1/° C.), and the temperature characteristic (the primary coefficient of temperature) of $V_{trim}$ is γ (1/° C.), the offset of $V_{out}$ may be expressed by the primary expression of temperature. If a condition where the offset of $V_{out}$ becomes zero at room temperature (here, 25° C.) and a condition where the temperature characteristic becomes a minimum at temperature T are applied, a relationship between the correction offset $V_{trim\_min}$ of the amplification-and-correction circuit 12 necessary to minimize the temperature characteristic of the offset of $V_{out}$ and the correction offset $V_{trim\_RT}$ of the amplification-and-correction circuit 12 necessary to zero the offset of $V_{out}$ at room temperature is expressed as, for example, the following Expression (1).

$$V_{trim\_min} = V_{trim\_RT} \cdot \frac{\alpha}{\gamma} \quad (1)$$

Figure 5:
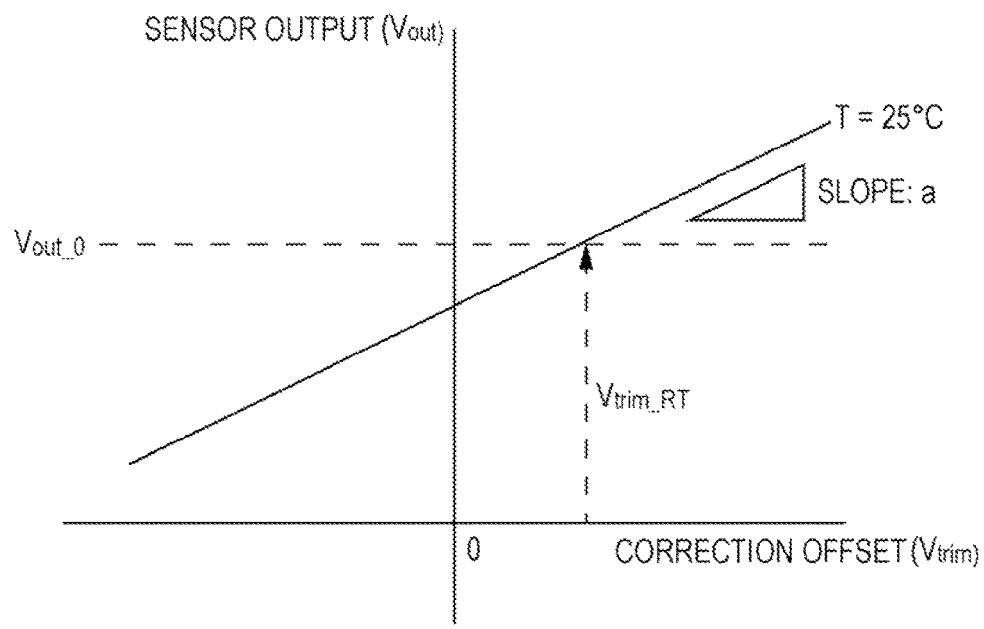
FIG. 5 is a graph illustrating a relationship between a correction offset of an amplification-and-correction circuit (the first operational amplifier) according to the first embodiment and a sensor output.

A method for obtaining individual parameters on the right side of the above-mentioned Expression (1) will be described. FIG. 5 is a graph illustrating a relationship between the correction offset (=$V_{trim}$) of the amplification-and-correction circuit 12 and a sensor output (=$V_{out}$) in a state in which there is not an input signal (corresponding to the current to be measured). $V_{trim\_RT}$ corresponds to a correction offset necessary to obtain an output $V_{out\_0}$ with which an offset becomes zero at room temperature. Therefore, from the graph in FIG. 5, it is possible to obtain $V_{trim\_RT}$ of the above-mentioned Expression (1). The graph illustrated in FIG. 5 may be derived based on the output characteristic of the amplification-and-correction circuit 12, acquired in advance in a state in which artificial circuits corresponding to, for example, the magnetoresistance effect elements M1 to M4 are connected.

Figure 6:
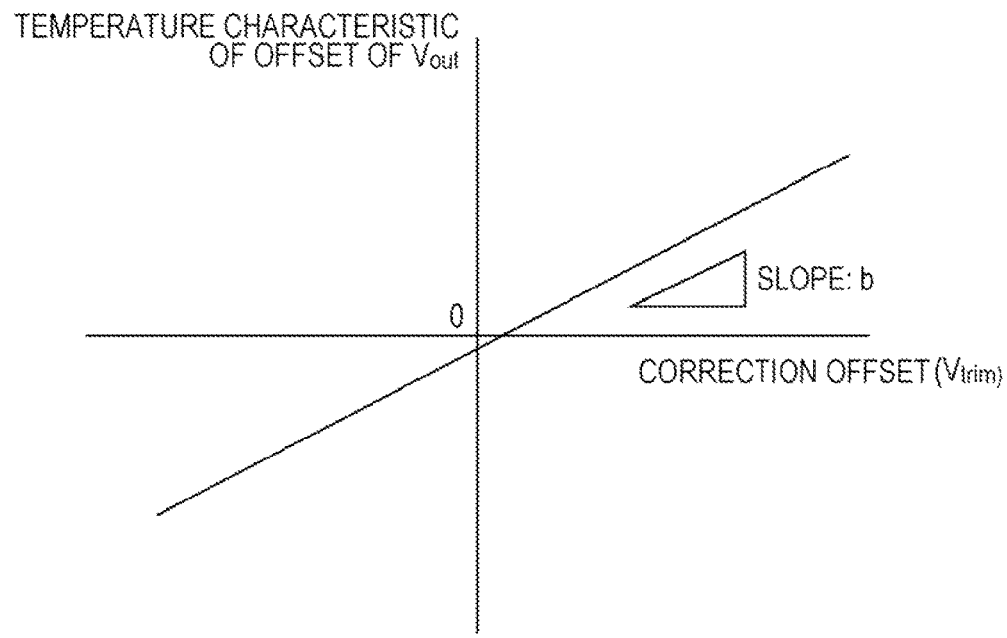
FIG. 6 is a graph illustrating a relationship between the correction offset of the amplification-and-correction circuit (the first operational amplifier) according to the first embodiment and a temperature characteristic of an offset of the sensor output.

FIG. 6 is a graph illustrating a relationship between the correction offset (=$V_{trim}$) of the amplification-and-correction circuit 12 and the temperature characteristic of the offset of the sensor output (=$V_{out}$). γ is a primary coefficient expressing the temperature characteristic of $V_{trim}$, and corresponds to a ratio b/a between a slope a of the graph illustrated in FIG. 5 and a slope b of the graph illustrated in FIG. 6. Therefore, it is possible to obtain γ from the above-mentioned FIG. 5 and FIG. 6. FIG. 6 may be derived from the characteristic of the operational amplifier 121 or the like, acquired in advance. α is a primary coefficient expressing the temperature characteristic of $V_{ofs}$, and may be derived based on the characteristics of the magnetoresistance effect elements M1 to M4, acquired in the stage of a wafer.

In this way, from the characteristics of the magnetoresistance effect elements M1 to M4, the operational amplifier 121, and so forth, acquirable in advance, and the above-mentioned Expression (1), it is possible to calculate the correction offset $V_{trim\_min}$ of the amplification-and-correction circuit 12 necessary to minimize the temperature characteristic of the offset. Therefore, such a first correction amount as to generate the first correction voltage $V_1$ corresponding to the correction offset $V_{trim\_min}$ is set in the amplification-and-correction circuit 12 (the correction circuit 122) before mounting of the magnetoresistance effect elements M1 to M4, and thus, it is possible to easily reduce the temperature dependency of the offset.

The characteristic variations of the magnetoresistance effect elements M1 to M4 within a same lot or a same wafer are small. Therefore, if the characteristic of a typical sample is acquired in advance, the characteristic may be used in common at the time of adjusting another current sensor 1. From this, it is unnecessary to actually measure the temperature characteristics of all the magnetoresistance effect elements M1 to M4 for each current sensor. Therefore, it is possible to further simplify adjustment.

Figure 7A:
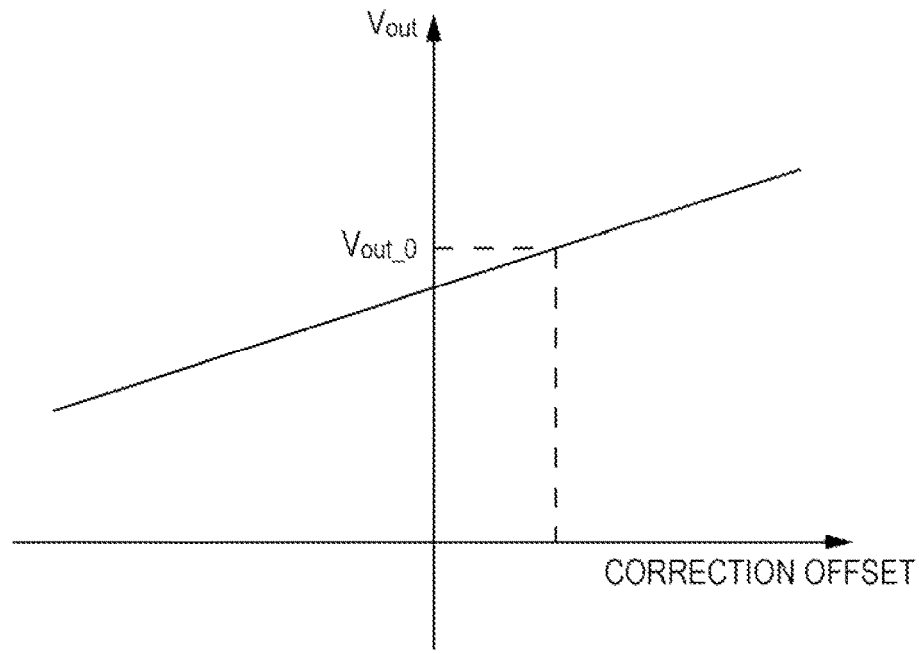
FIG. 7A is a graph illustrating a relationship between a correction offset of an operational amplifier (a second operational amplifier) according to the first embodiment and a sensor output.
Figure 7B:
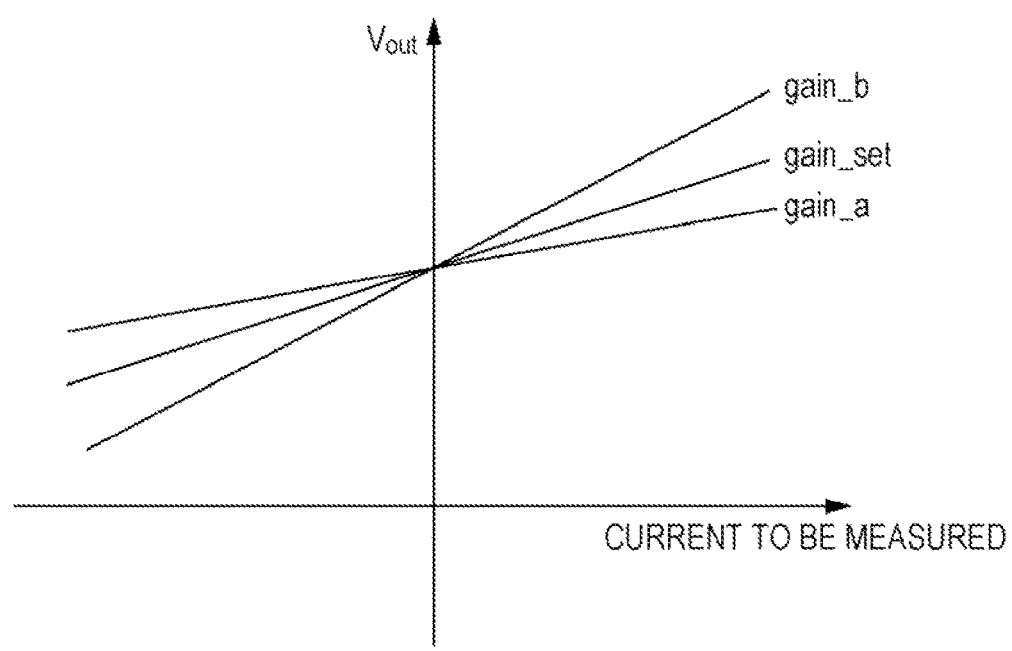
FIG. 7B is a graph illustrating an output change with respect to a current to be measured.

After the first correction amount is set in the amplification-and-correction circuit 12, the magnetoresistance effect elements M1 to M4 to configure the current measurement circuit 11 are mounted in a substrate. In this state, the temperature dependency of the offset is minimized. Therefore, it is possible to set the second correction amount and the third correction amount in the amplification-and-correction circuit 13 by simple measurement. As illustrated in, for example, FIG. 7B, by actually measuring an output change with respect to the current to be measured, at two levels (gain_a and gain_b) at which correction amounts are different, it is possible to determine, from a ratio between changes therein, the third correction amount for achieving a desired sensitivity (gain_set). In addition, as illustrated in FIG. 7A, from a relationship between the correction offset generated in the operational amplifier 131 and the sensor output (=$V_{out}$), it is possible to determine the second correction amount for correcting the offset of $V_{out}$. If the second correction amount and the third correction amount are set in the amplification-and-correction circuit 13, the current sensor 1 is completed.

In this way, in the current sensor 1 and the manufacturing method therefor of the present embodiment, the first amplification-and-correction circuit 12 configured to correct the temperature characteristic of an offset and the second amplification-and-correction circuit 13 configured to correct the magnitude of the offset are separately provided, and after the first correction amount is set in the first amplification-and-correction circuit 12, based on the characteristics of the magnetoelectric conversion elements M1 to M4, and the temperature characteristic of the offset is corrected, the second correction amount is set in the second amplification-and-correction circuit 13 and the magnitude of the offset is corrected. Therefore, it is possible to perform correction of the temperature characteristic of the offset and correction of the magnitude of the offset in an isolated manner. From this, it is unnecessary to acquire temperature characteristics under many conditions, and it is possible to achieve high current measurement accuracy by simple adjustment.

In addition, in the current sensor 1 and the manufacturing method therefor of the present embodiment, the first correction amount of the first amplification-and-correction circuit 12 may be set so that the influence of the temperature characteristic of the offset becomes small. Therefore, it is possible to adequately remove the influence of the temperature characteristic of the offset. In addition, the current sensor 1 may be a magnetic proportional type utilizing the output of the current measurement circuit 11 proportional to an external magnetic field. Therefore, it is possible to adjust the offset by simple correction processing utilizing the above-mentioned Expression (1).

In addition, while, in the present embodiment, after the first correction amount is set in the amplification-and-correction circuit 12, based on the characteristics of the magnetoelectric conversion elements M1 to M4, the magnetoresistance effect elements M1 to M4 to configure the current measurement circuit 11 are mounted in a substrate and the second correction amount is set in the second amplification-and-correction circuit 13, the manufacturing method for the current sensor 1 is not limited to this. After mounting the magnetoresistance effect elements (magnetoelectric conversion elements) M1 to M4 in the substrate, the first correction amount of the first amplification-and-correction circuit 12 and the second correction amount of the second amplification-and-correction circuit 13 may be set.

Figure 8:
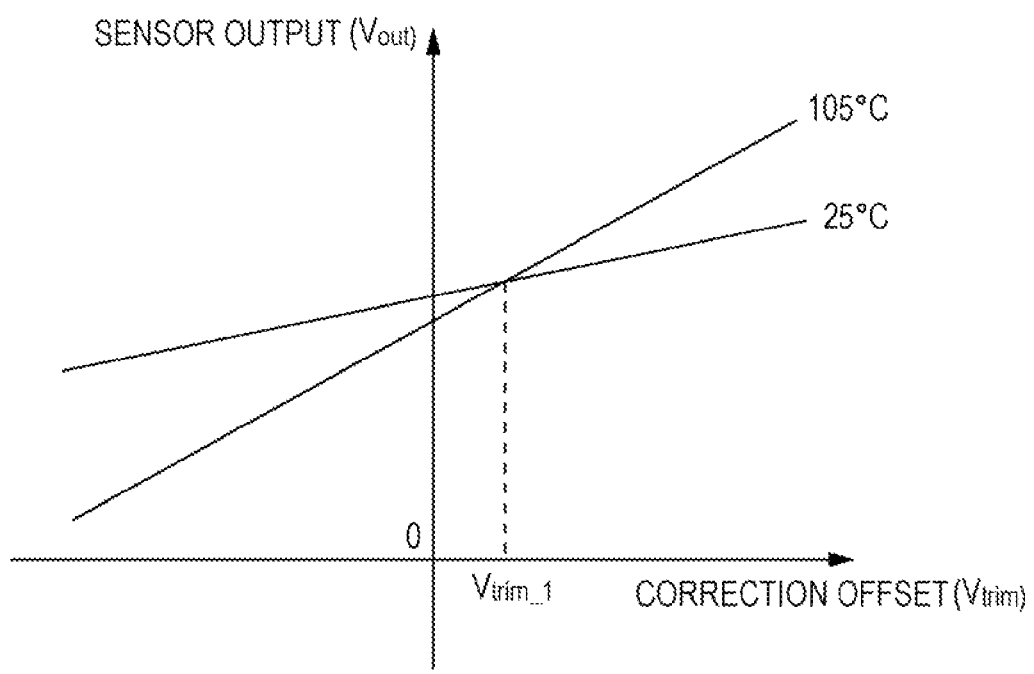
FIG. 8 is a graph illustrating a characteristic of the correction offset of the amplification-and-correction circuit (the first operational amplifier) according to the first embodiment.

FIG. 8 is a graph illustrating the characteristic of the correction offset of the amplification-and-correction circuit 12. In a case where the first correction amount of the first amplification-and-correction circuit 12 is set after the magnetoresistance effect elements M1 to M4 are mounted in the substrate, a relationship between the correction offset (=$V_{trim}$) and the output of the amplification-and-correction circuit 12 is actually measured under, for example, two different temperature conditions. As illustrated in FIG. 8, from the point of intersection between two graphs under the different temperature conditions (here, 25° C. and 105° C.), it is possible to obtain the first correction amount corresponding to a correction offset $V_{trim\_1}$.

Second Embodiment

Figure 9:
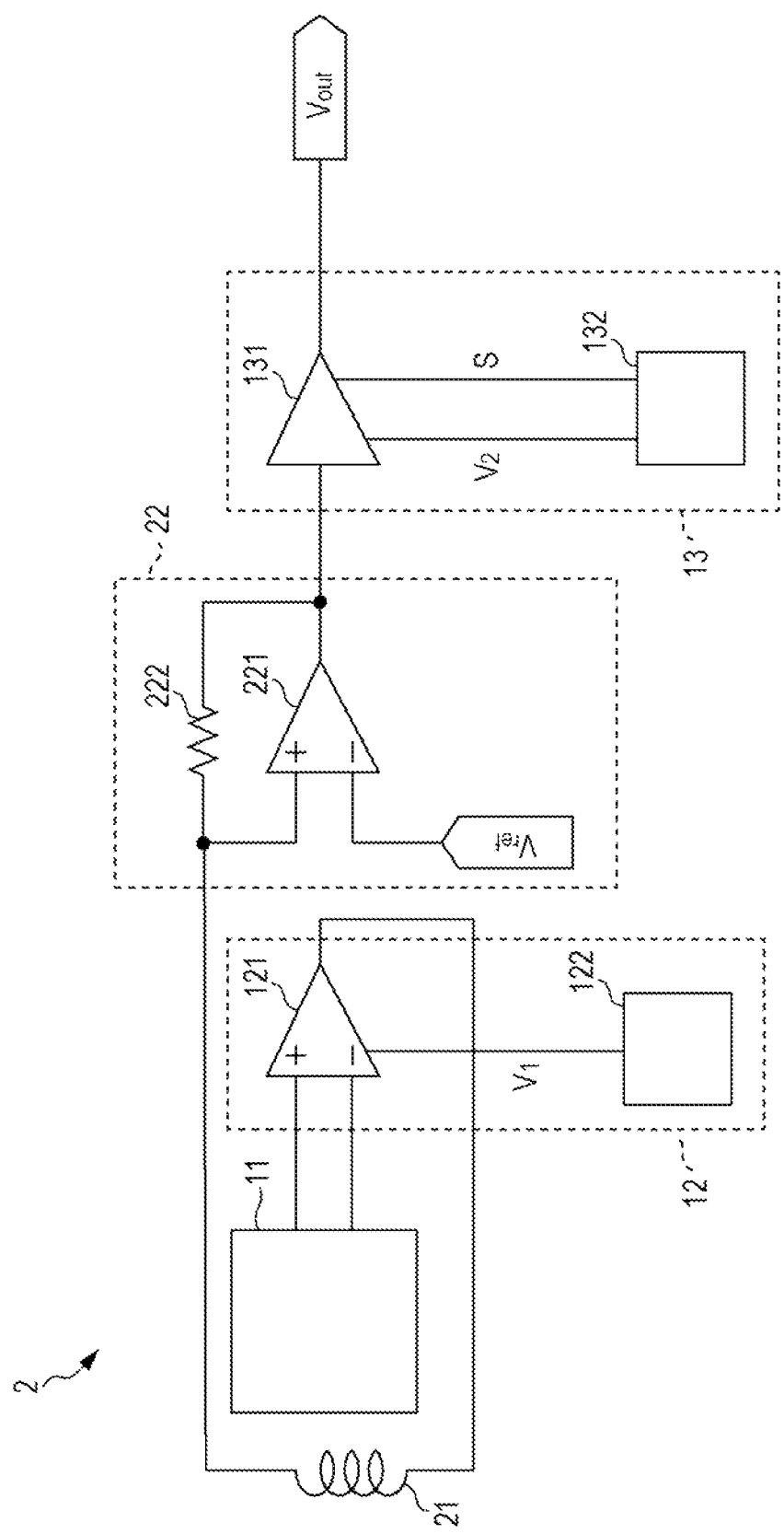
FIG. 9 is a block diagram illustrating an example of a configuration of a magnetic balance type current sensor according to a second embodiment.

In the present embodiment, a current sensor having a form different from the above-mentioned embodiment will be described. FIG. 9 is a block diagram illustrating an example of the configuration of a magnetic balance type current sensor 2 according to the present embodiment. In addition, the current sensor 2 according to the present embodiment and the current sensor 1 according to the first embodiment have a lot in common with each other. Therefore, a common symbol is assigned to a common configuration, and the detailed description thereof will be omitted.

As illustrated in FIG. 9, the current sensor 2 of the present embodiment includes the current measurement circuit 11 that converts an induction magnetic field generated by a current to be measured into an electric signal. The amplification-and-correction circuit (the first amplification-and-correction circuit) 12 is connected in the subsequent stage of the current measurement circuit 11. A feedback coil 21 is connected to an output terminal of the operational amplifier 121 in the amplification-and-correction circuit 12. The feedback coil 21 is configured using, for example, a spiral-shaped planar conductive pattern. A current (feedback current) flows from the operational amplifier 121 into this conductive pattern, and thus, a cancelling magnetic field that corresponds to the induction magnetic field and whose direction is opposite thereto is generated. In addition, the shape or the like of the feedback coil 21 is not specifically limited.

An I/V amplifier 22 that converts the feedback current into a voltage is connected to the feedback coil 21. The I/V amplifier 22 is configured to include an operational amplifier 221, and an inverting input terminal (−) thereof is connected to the feedback coil 21. A reference voltage is applied to a non-inverting input terminal (+) of the operational amplifier 221. An output terminal of the operational amplifier 221 is connected to the inverting input terminal (−) of the operational amplifier 221 through a resistance element 222. In addition, the output terminal of the operational amplifier 221 is connected to the amplification-and-correction circuit (the second amplification-and-correction circuit) 13.

The current sensor 2 of the present embodiment is manufactured in the same method as that of the current sensor 1. In other words, the magnetoresistance effect elements M1 to M4 to configure the current measurement circuit 11 are mounted in a substrate (not illustrated) in which the amplification-and-correction circuits 12 and 13 are mounted, and thus, the current sensor 2 is manufactured. In the present embodiment, before mounting of the magnetoresistance effect elements M1 to M4, the first correction amount is set in the amplification-and-correction circuit 12 (the correction circuit 122). The first correction amount may be set based on the temperature characteristics of the magnetoresistance effect elements M1 to M4 and so forth.

Figure 10:
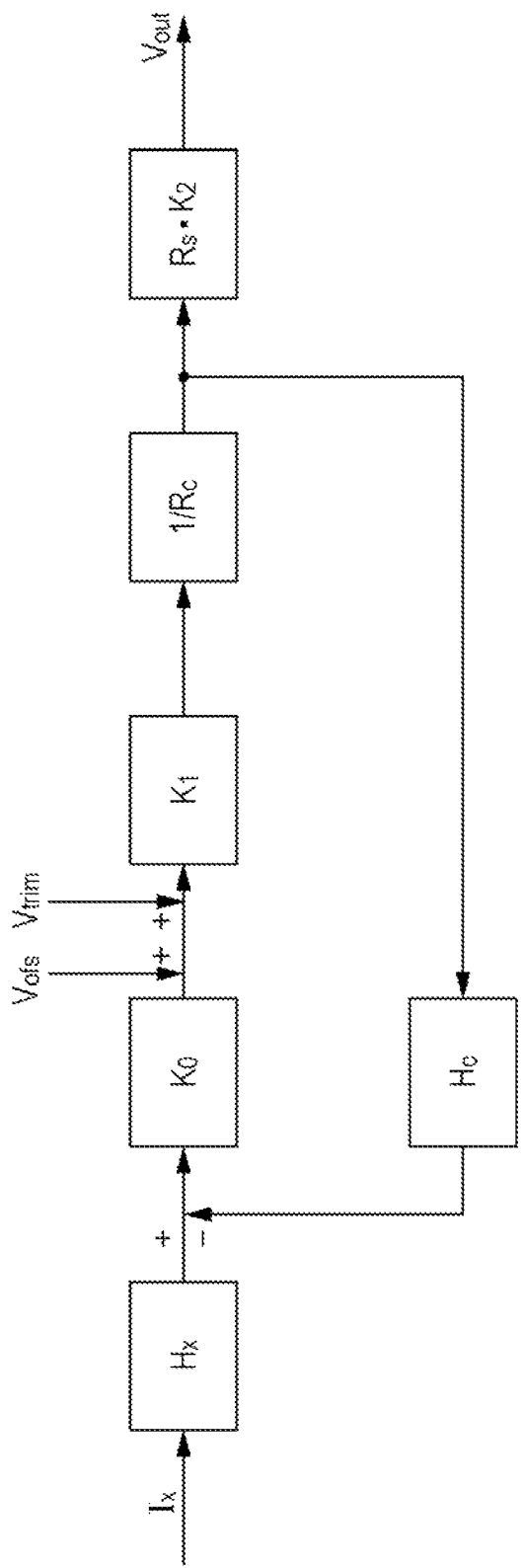
FIG. 10 is a block diagram illustrating a relationship between inputting and outputting of signals of the current sensor according to the second embodiment.

An example of a calculation method for the first correction amount set in the amplification-and-correction circuit 12 will be described. FIG. 10 is a block diagram illustrating a relationship between inputting and outputting of signals of the current sensor 2 of the present embodiment. In FIG. 10, $I_x$ indicates an input signal (corresponding to the current to be measured) to the current measurement circuit 11, $H_x$ indicates the conversion coefficient of a magnetic field in the current measurement circuit 11, $K_0$ indicates the sensitivity of the current measurement circuit 11, $K_1$ indicates the amplification factor of the amplification-and-correction circuit 12, $R_c$ indicates the impedance of the feedback coil 21, $H_c$ indicates the conversion coefficient of a magnetic field in the feedback coil 21, $R_s$ indicates the resistance value of the resistance element 222, $K_2$ indicates the amplification factor of the amplification-and-correction circuit 13, and $V_{out}$ indicates the output (voltage) of the current sensor 2. In addition, $V_{ofs}$ indicates an offset (voltage) generated in the current measurement circuit 11, and $V_{trim}$ indicates the correction offset (voltage) of the amplification-and-correction circuit 12.

In the current sensor 2, the offset of $V_{out}$ has a temperature characteristic. If it is assumed that temperature is T (° C.), the temperature characteristic of $V_{ofs}$ is α (1/° C.), the temperature characteristic of $V_{trim}$ is γ (1/° C.), the temperature characteristic of the sensitivity of the current measurement circuit 11 is β (1/° C.), and the temperature characteristic of the sensitivity caused by a magnetic balance type is δ (1/° C.), the offset of $V_{out}$ may be expressed by the primary expression of temperature. If a condition where the offset of $V_{out}$ becomes zero at room temperature (here, 25° C.) and a condition where the temperature characteristic becomes a minimum at temperature T are applied, a relationship between the correction offset $V_{trim\_min}$ of the amplification-and-correction circuit 12 necessary to minimize the temperature characteristic of the offset of $V_{out}$ and the correction offset $V_{trim\_RT}$ of the amplification-and-correction circuit 12 necessary to zero the offset at room temperature is expressed as, for example, the following Expression (2).

$$V_{trim\_min} = V_{trim\_RT} \cdot \frac{\beta + \delta - \alpha}{\beta + \delta - \gamma} \quad (2)$$

Based on the above-mentioned Expression (2), it is possible to calculate the correction offset $V_{trim\_min}$ of the amplification-and-correction circuit 12 necessary to minimize the temperature characteristic of the offset, from various kinds of characteristics acquirable in advance. Therefore, such a first correction amount as to generate the first correction voltage $V_1$ corresponding to the correction offset $V_{trim\_min}$ is set in the amplification-and-correction circuit 12 (the correction circuit 122) before mounting of the magnetoresistance effect elements M1 to M4, and thus, it is possible to easily reduce the temperature dependency of the offset.

After the first correction amount is set in the amplification-and-correction circuit 12, the magnetoresistance effect elements M1 to M4 to configure the current measurement circuit 11 are mounted in the substrate. In this state, the temperature dependency of the offset is minimized. Therefore, it is possible to set the second correction amount and the third correction amount in the amplification-and-correction circuit 13 by simple measurement. If the second correction amount and the third correction amount are set in the amplification-and-correction circuit 13, the current sensor 2 is completed.

In this way, in the current sensor 2 of the present embodiment, the first amplification-and-correction circuit 12 configured to correct the temperature characteristic of an offset and the second amplification-and-correction circuit 13 configured to correct the magnitude of the offset are separately provided, and after the first correction amount is set in the first amplification-and-correction circuit 12, based on the characteristics of the magnetoelectric conversion elements M1 to M4, and the temperature characteristic of the offset is corrected, the second correction amount is set in the second amplification-and-correction circuit 13 and the magnitude of the offset is corrected. Therefore, it is possible to perform correction of the temperature characteristic of the offset and correction of the magnitude of the offset in an isolated manner. From this, it is unnecessary to acquire temperature characteristics under many conditions, and it is possible to achieve high current measurement accuracy by simple adjustment. The configuration or the method illustrated in the present embodiment may be implemented by being arbitrarily combined with a configuration or a method illustrated in another embodiment.

Third Embodiment

Figure 11:
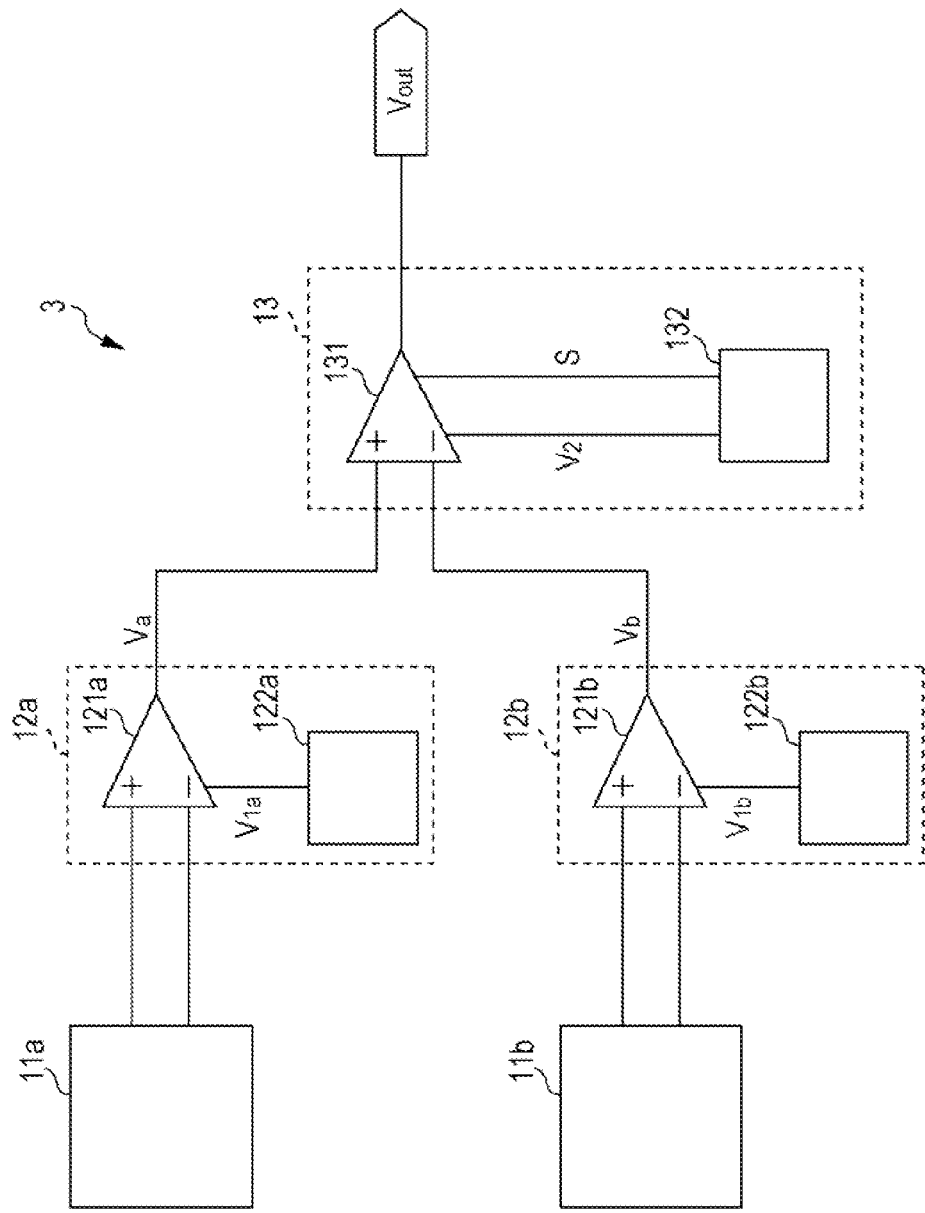
FIG. 11 is a block diagram illustrating an example of a configuration of a differential type current sensor according to a third embodiment.

In the present embodiment, a current sensor having a form different from the above-mentioned embodiments will be described. FIG. 11 is a block diagram illustrating an example of the configuration of a differential type current sensor 3 according to the present embodiment. In addition, the current sensor 3 according to the present embodiment and the current sensor 1 according to the first embodiment have a lot in common with each other. Therefore, a common symbol is assigned to a common configuration, and the detailed description thereof will be omitted.

As illustrated in FIG. 11, the current sensor 3 of the present embodiment includes current measurement circuits 11a and 11b that each convert an induction magnetic field generated by a current to be measured into an electric signal. Amplification-and-correction circuits (the first amplification-and-correction circuit) 12a and 12b are connected in the subsequent stages of the current measurement circuits 11a and 11b, respectively. The configuration of each of the current measurement circuits 11a and 11b is the same as that of the current measurement circuit 11 of the first embodiment, and the configuration of each of the amplification-and-correction circuits 12a and 12b is the same as that of the amplification-and-correction circuit 12 of the first embodiment.

In the amplification-and-correction circuits 12a and 12b, the output terminals of operational amplifiers 121a and 121b are connected to the non-inverting input terminal (+) and the inverting input terminal (−) of the operational amplifier 131, respectively. The amplification-and-correction circuit 13 calculates a difference between an output $V_a$ of the amplification-and-correction circuit 12a and an output $V_b$ of the amplification-and-correction circuit 12b, and corrects the magnitude of an offset and a sensitivity.

Figure 12:
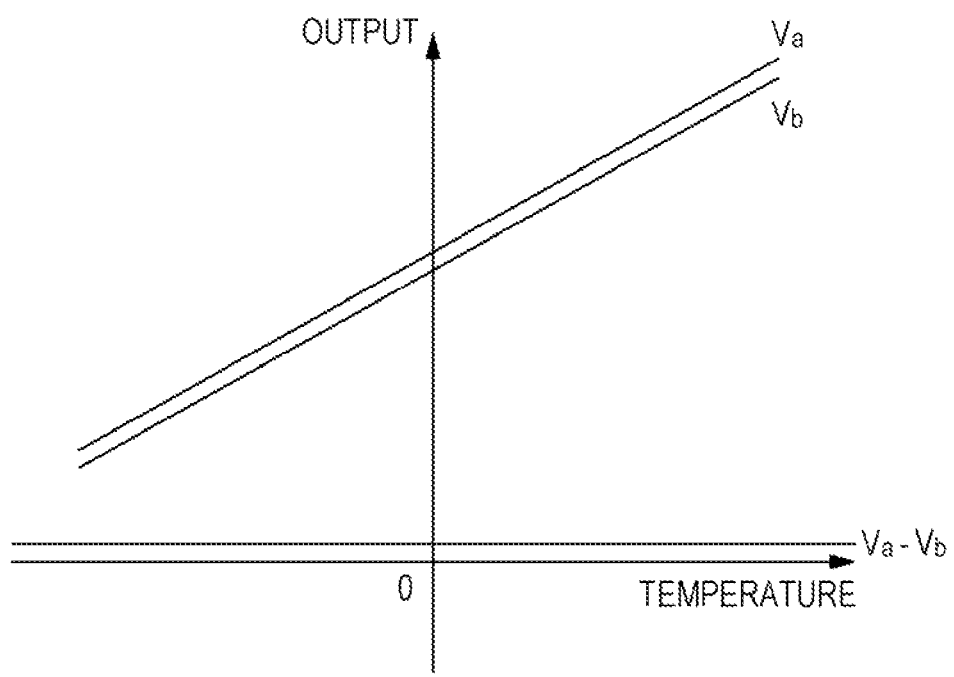
FIG. 12 is a graph illustrating temperature characteristics of outputs in a state where a current to be measured is zero in the current sensor according to the third embodiment.

In such a differential type current sensor 3, by performing correction so that the temperature characteristics of offsets become equal to each other in the amplification-and-correction circuits 12a and 12b, it is possible to cancel out the temperature characteristics of offsets. FIG. 12 is a graph illustrating the temperature characteristics of outputs in a state where the current to be measured is zero. As illustrated in FIG. 12, the temperature characteristics of offsets are corrected in the amplification-and-correction circuits 12a and 12b so that a difference between the output $V_a$ of the amplification-and-correction circuit 12a and the output $V_b$ of the amplification-and-correction circuit 12b becomes constant independently from temperature.

The temperature characteristics of offsets generated in the current measurement circuits 11a and 11b are corrected in the amplification-and-correction circuits 12a and 12b so as to become equal to each other, and thus, it is possible to cancel out the temperature characteristics of offsets. In other words, the current sensor 3 may be put into a differential type utilizing the current measurement circuits 11a and 11b, and thus, it is possible to cancel out the temperature characteristics of offsets and achieve high current measurement accuracy.

In addition, since, in the current sensor 3 of the present embodiment, it is possible to cancel out the temperature characteristics of offsets, it is not necessary to minimize the temperature characteristics of offsets in the amplification-and-correction circuits 12a and 12b. The configuration or the method illustrated in the present embodiment may be implemented by being arbitrarily combined with a configuration or a method illustrated in another embodiment.

As described above, in the current sensors 1, 2, and 3 and the manufacturing methods therefor of the present invention, the amplification-and-correction circuits (the first amplification-and-correction circuit) 12, 12a, and 12b that each correct the temperature characteristic of an offset and the amplification-and-correction circuit (the second amplification-and-correction circuit) 13 that corrects the magnitude of the offset are separately provided, and after the first correction amount is set in each of the amplification-and-correction circuits 12, 12a, and 12b, based on the characteristics of the magnetoelectric conversion elements, and the temperature characteristic of the offset is corrected, the second correction amount is set in the amplification-and-correction circuit 13 and the magnitude of the offset is corrected. Therefore, it is possible to perform correction of the temperature characteristic of the offset and correction of the magnitude of the offset in an isolated manner. From this, it is unnecessary to acquire temperature characteristics under many conditions, and it is possible to achieve high current measurement accuracy by simple adjustment.

In addition, while, in each of the above-mentioned embodiments, the current sensor in which the bridge circuit configuring the current measurement circuit is configured using the four magnetoresistance effect elements is exemplified, the bridge circuit may be configured to include a fixed resistance element or the like, whose resistance value is not caused to change by an external magnetic field. In addition, if being capable of detecting an induction magnetic field, the current measurement circuit may be a circuit other than the bridge circuit.

In addition, a connection relationship between individual elements, the sizes thereof, and so forth in the above-mentioned embodiments may be modified without changing the spirit of the invention. In addition, the configurations, the methods, and so forth illustrated in the above-mentioned embodiments may be implemented with being arbitrarily combined. In addition to this, the present invention may be modified and implemented without departing from the scope of the invention.

An current sensor of the present invention may be used for sensing the magnitude of a motor driving current of, for example, an electric vehicle, a hybrid vehicle, or the like.

What is claimed is:

1. A method for manufacturing a current sensor including a current measurement circuit including magnetoelectric conversion elements, a first amplification-and-correction circuit configured to amplify an output of the current measurement circuit and correct, based on a first correction amount, a temperature characteristic of an offset, a second amplification-and-correction circuit configured to amplify an output of the first amplification-and-correction circuit so as to adjust a sensitivity, and correct, based on a second correction amount, a magnitude of the offset, and a substrate on which the current measurement circuit, the first amplification-and-correction circuit, and the second amplification-and-correction circuit are provided, the method comprising:

setting the first correction amount based on characteristics of a sample magnetoelectric conversion element taken from a same lot or wafer from which the magnetoelectric conversion elements are obtained;

mounting the magnetoelectric conversion elements on the substrate after the setting the first correction amount; and setting the second correction amount after the mounting.

2. The method for manufacturing a current sensor according to claim 1, wherein the first correction amount is set so as to reduce temperature dependency of the offset.

3. The method for manufacturing a current sensor according to claim 1, wherein each of the magnetoelectric conversion elements is a magnetoresistance effect element.

4. The method for manufacturing a current sensor according to claim 1, wherein the current sensor is a magnetic proportional type sensor utilizing the output of the current measurement circuit proportional to an external magnetic field.

5. The method for manufacturing a current sensor according to claim 1, wherein the current sensor is a differential type sensor including another set of the current measurement circuit and the first amplification-and-correction circuit, the second amplification-and-correction circuit performing a differential operation on outputs of the current measurement circuits.

* * * * *